(12) United States Patent
Wei et al.

(10) Patent No.: US 8,742,442 B2
(45) Date of Patent: Jun. 3, 2014

(54) METHOD FOR PATTERNING AN EPITAXIAL SUBSTRATE, A LIGHT EMITTING DIODE AND A METHOD FOR FORMING A LIGHT EMITTING DIODE

(75) Inventors: Cheng-Hung Wei, Hsinchu (TW); Bo-Wen Lin, Hsinchu (TW); Ching-Yen Peng, Hsinchu (TW); Hao-Chung Kuo, Hsinchu (TW); Wen-Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 79 days.

(21) Appl. No.: 13/450,424

(22) Filed: Apr. 18, 2012

(65) Prior Publication Data

US 2012/0273821 A1 Nov. 1, 2012

(30) Foreign Application Priority Data

Apr. 27, 2011 (TW) .............................. 100114649 A

(51) Int. Cl.
*H01L 33/20* (2010.01)

(52) U.S. Cl.
USPC 257/98; 257/99; 257/E33.005; 257/E33.006; 438/29; 438/700

(58) Field of Classification Search
CPC ............................... H01L 33/007; H01L 33/22
USPC ................... 257/79–103, E33.005, E33.006, 257/E33.074, E21.249; 438/29, 700; 216/41, 48
See application file for complete search history.

(56) References Cited

U.S. PATENT DOCUMENTS

| | | | | |
|---|---|---|---|---|
| 6,860,956 B2* | 3/2005 | Bao et al. | ....................... | 156/232 |
| 6,943,117 B2* | 9/2005 | Jeong et al. | .................... | 438/694 |
| 7,098,976 B2* | 8/2006 | Minoura et al. | ............... | 349/113 |
| 7,215,393 B2* | 5/2007 | Kawaguri et al. | ............. | 349/113 |
| 7,384,809 B2* | 6/2008 | Donofrio | ......................... | 438/29 |
| 7,518,676 B2* | 4/2009 | Minoura et al. | ............... | 349/113 |
| 7,692,201 B2* | 4/2010 | Kim et al. | ........................ | 257/95 |
| 7,829,906 B2* | 11/2010 | Donofrio | ........................ | 257/98 |
| 7,977,695 B2* | 7/2011 | Shim et al. | ....................... | 257/98 |
| 8,044,422 B2* | 10/2011 | Dai et al. | ........................ | 257/98 |
| 8,071,994 B2* | 12/2011 | Kim et al. | ....................... | 257/98 |
| 8,227,280 B2* | 7/2012 | Niki et al. | ........................ | 438/46 |
| 8,263,995 B2* | 9/2012 | Donofrio | ........................ | 257/98 |
| 8,299,486 B2* | 10/2012 | Niki et al. | ....................... | 257/98 |
| 8,344,402 B2* | 1/2013 | Niki et al. | ....................... | 257/98 |
| 8,344,403 B2* | 1/2013 | Niki et al. | ....................... | 257/98 |
| 8,372,669 B2* | 2/2013 | Kim et al. | ....................... | 438/29 |
| 8,377,728 B1* | 2/2013 | Zhu et al. | ........................ | 438/29 |
| 8,404,503 B1* | 3/2013 | Zhu et al. | ........................ | 438/29 |
| 8,404,504 B1* | 3/2013 | Zhu et al. | ........................ | 438/29 |

(Continued)

FOREIGN PATENT DOCUMENTS

JP 2008270689 A * 11/2008

*Primary Examiner* — Marvin Payen
*Assistant Examiner* — Victor Barzykin
(74) *Attorney, Agent, or Firm* — Lun-Cong Dong; LeDPatent, LLC

(57) ABSTRACT

A method for patterning an epitaxial substrate includes: (a) forming an etch mask layer over an epitaxial substrate, and patterning the etch mask layer using a patterned cover mask layer to form the etch mask layer into a plurality of spaced apart mask patterns; and (b) etching the epitaxial substrate that is exposed from the mask patterns, and removing the mask patterns such that the epitaxial substrate is formed with a plurality of spaced apart substrate patterns.

11 Claims, 13 Drawing Sheets

(56) References Cited

U.S. PATENT DOCUMENTS

| | | | |
|---|---|---|---|
| 8,455,282 B2* | 6/2013 | Kim et al. | 438/42 |
| 8,455,906 B2* | 6/2013 | Kim et al. | 257/98 |
| 8,476,658 B2* | 7/2013 | Dai et al. | 257/98 |
| 2006/0226431 A1* | 10/2006 | Lee et al. | 257/79 |
| 2009/0258454 A1* | 10/2009 | Kim et al. | 438/46 |
| 2010/0059789 A1* | 3/2010 | Choi | 257/103 |
| 2010/0065877 A1* | 3/2010 | Kim et al. | 257/98 |
| 2010/0187558 A1* | 7/2010 | Jeong | 257/99 |
| 2011/0001158 A1* | 1/2011 | Kim et al. | 257/98 |
| 2011/0124139 A1* | 5/2011 | Chang | 438/40 |
| 2011/0156000 A1* | 6/2011 | Cheng | 257/13 |
| 2011/0198560 A1* | 8/2011 | Okagawa et al. | 257/13 |
| 2011/0294389 A1* | 12/2011 | Kim | 445/44 |
| 2012/0001152 A1* | 1/2012 | Kim et al. | 257/13 |
| 2012/0018758 A1* | 1/2012 | Matioli et al. | 257/98 |
| 2012/0074097 A1* | 3/2012 | Lee et al. | 216/48 |
| 2012/0074453 A1* | 3/2012 | Wuu et al. | 257/99 |
| 2012/0112239 A1* | 5/2012 | Choi | 257/103 |
| 2012/0299014 A1* | 11/2012 | Hikosaka et al. | 257/77 |
| 2012/0299034 A1* | 11/2012 | Chao et al. | 257/91 |
| 2012/0305942 A1* | 12/2012 | Lo et al. | 257/77 |

* cited by examiner

METHOD FOR PATTERNING AN EPITAXIAL SUBSTRATE, A LIGHT EMITTING DIODE AND A METHOD FOR FORMING A LIGHT EMITTING DIODE

CROSS-REFERENCE TO RELATED APPLICATION

This application claims priority of Taiwanese application no. 100114649, filed on Apr. 27, 2011.

BACKGROUND OF THE INVENTION

1. Field of the Invention

This invention relates to a method for patterning an epitaxial substrate, a light emitting diode and a method for forming a light emitting diode.

2. Description of the Related Art

Referring to FIG. 1, a conventional light emitting diode (LED) includes an epitaxial substrate 11 and a light-emitting unit 12 formed on the epitaxial substrate 11. The light-emitting unit 12 includes a first type semiconductor layer 121 connected to the epitaxial substrate 11, a light-emitting layer 122 formed on a portion of the first type semiconductor layer 121, a second type semiconductor layer 123 formed on the light-emitting layer 122, and first and second electrodes 124, 125 that are respectively formed on a remaining portion of the first type semiconductor layer 121 and the second type semiconductor layer 123. When external power is applied to the first and second electrodes 124, 125, the light-emitting layer 122 will emit light due to photoelectric effect.

Presently, the light-emitting unit 12 is usually made of a GaN type semiconductor material having a refractive index of about 2.5, and air has a refractive index of 1. Accordingly, when light emitted from the light-emitting layer 122 travels to an interface between the light-emitting unit 12 and air, it is likely to totally reflect at the interface due to the refractive index differences between the light-emitting unit 12 and air, and thus, light will travel between the epitaxial substrate 11 and the light-emitting unit 12. Thus, the conventional LED has a relatively low light extraction rate. In order to reduce the total reflection at the interface between the light-emitting unit 12 and air, the epitaxial substrate 11 that is roughened to have different patterns has been proposed. For example, the epitaxial substrate 11 may be roughened to form an irregular structure on a surface thereof, or to form a matrix of protrusions on the surface thereof. With the patterns on the epitaxial substrate 11, the traveling direction of light may be varied when the light travels to the epitaxial substrate 11, thereby reducing the possibility of total reflection and enhancing the light extraction rate of the LED.

Referring to FIG. 2, a method for forming a light emitting device is disclosed in U.S. patent application publication no. 2010/0059789, in which an epitaxial substrate 2 is formed with a roughened surface so as to improve a light extraction rate of the light emitting device. The epitaxial substrate 2 is formed by: (1) lithographically patterning a photoresist layer on a substrate 21 to form a plurality of photoresist patterns 101 using a photomask (not shown); (2) conducting a first etching process on the substrate 21 that is uncovered by the photoresist patterns 101 to form a plurality of substrate patterns 102; (3) conducting a heat treatment of the photoresist patterns 101 and the substrate 21 so that the photoresist patterns 101 have uneven thickness and so that the substrate patterns 102 are deformed; and (4) conducting a second etching process on the photoresist patterns 101 and the substrate 21, followed by removing the photoresist patterns 101, so as to form the substrate patterns 102 including a plurality of protrusions 104 each of which has a concave portion 103 indented from a top face of the protrusion 104. With the substrate patterns 102, the light extraction rate of the light emitting device is enhanced, and an epitaxial layer formed on the epitaxial substrate 2 in a subsequent process has an improved quality.

The heat treatment is conducted to vary the thicknesses of the photoresist patterns 101 and the shapes of the substrate patterns 102. By virtue of the differing thickness of the photoresist, the substrate patterns 102 having the protrusions 104 and the concave portions 103 are thus obtained using the second etching process. In order to form the desired substrate patterns 102, the heat treatment and the second etching process should be precisely controlled, and the substrate patterns 102 are limited to a bowl-shape. Besides, since the differing thickness of the photoresist produced by heat treatment is relatively hard to be controlled, the uniformity of the substrate patterns 102 is hard to be achieved.

SUMMARY OF THE INVENTION

Therefore, an object of the present invention is to provide a method for patterning an epitaxial substrate, a light emitting diode, and a method for forming a light emitting diode that can overcome the aforesaid drawbacks associated with the prior art.

According to a first aspect of this invention, a method for patterning an epitaxial substrate comprises:

(a) forming an etch mask layer over an epitaxial substrate, and patterning the etch mask layer using a patterned cover mask layer to form the etch mask layer into a plurality of spaced apart mask patterns, each of the mask patterns having at least one first mask region that masks the epitaxial substrate, a plurality of exposing regions that expose the epitaxial substrate, and a second mask region that masks the epitaxial substrate, that surrounds the first mask region and the exposing regions, and that is spaced apart from the first mask region by the exposing regions; and (b) etching the epitaxial substrate that is exposed from the mask patterns, and removing the mask patterns such that the epitaxial substrate is formed with a plurality of spaced apart substrate patterns, each of the substrate patterns having a surrounding wall, a cavity that is defined by the surrounding wall, and at least one protrusion that is disposed in the cavity.

According to a second aspect of this invention, a light emitting diode comprises:

an epitaxial substrate including a top surface and a plurality of substrate patterns on the top surface, each of the substrate patterns having a surrounding wall protruding from the top surface, a cavity defined by the surrounding wall, and at least one protrusion disposed in the cavity; and a light-emitting unit that is disposed on the substrate patterns of the top surface and that is capable of emitting light.

Accordingly, when the light-emitting unit emits light by virtue of photoelectric effect, photons that travel toward and hit the substrate patterns will be reflected and thus travel outwardly.

According to a third aspect of this invention, a method for forming a light emitting diode comprises:

(a) forming an etch mask layer over an epitaxial substrate, and patterning the etch mask layer using a patterned cover mask layer to form the etch mask layer into a plurality of spaced apart mask patterns, each of the mask patterns having at least one first mask region that masks the epitaxial substrate, a plurality of exposing regions that expose the epitaxial substrate and surround the first mask region, and a second mask region that masks the epitaxial substrate, that surrounds the first mask region and the exposing regions, and that is spaced apart from the first mask region by the exposing regions;

(b) etching the epitaxial substrate that is exposed from the mask patterns, and removing the mask patterns such that the epitaxial substrate is formed with a plurality of spaced apart substrate patterns, each of the substrate patterns having a surrounding wall, a cavity that is defined by the surrounding wall, and at least one protrusion that is disposed in the cavity; and (c) forming a light-emitting unit on the substrate patterns of the epitaxial substrate.

The effect of this invention resides in that a plurality of substrate patterns can be formed in a single etching process by virtue of a well-designed photomask (i.e., a patterned cover mask layer that is used to form the mask patterns). Accordingly, the light emitting diode of this invention can be formed by a simple and easy-controlled method, and the uniformity of the substrate patterns can be enhanced. Resides, the geometric shape of the substrate patterns can be easily varied by varying the design of the mask patterns (i.e., the design of the photomask).

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
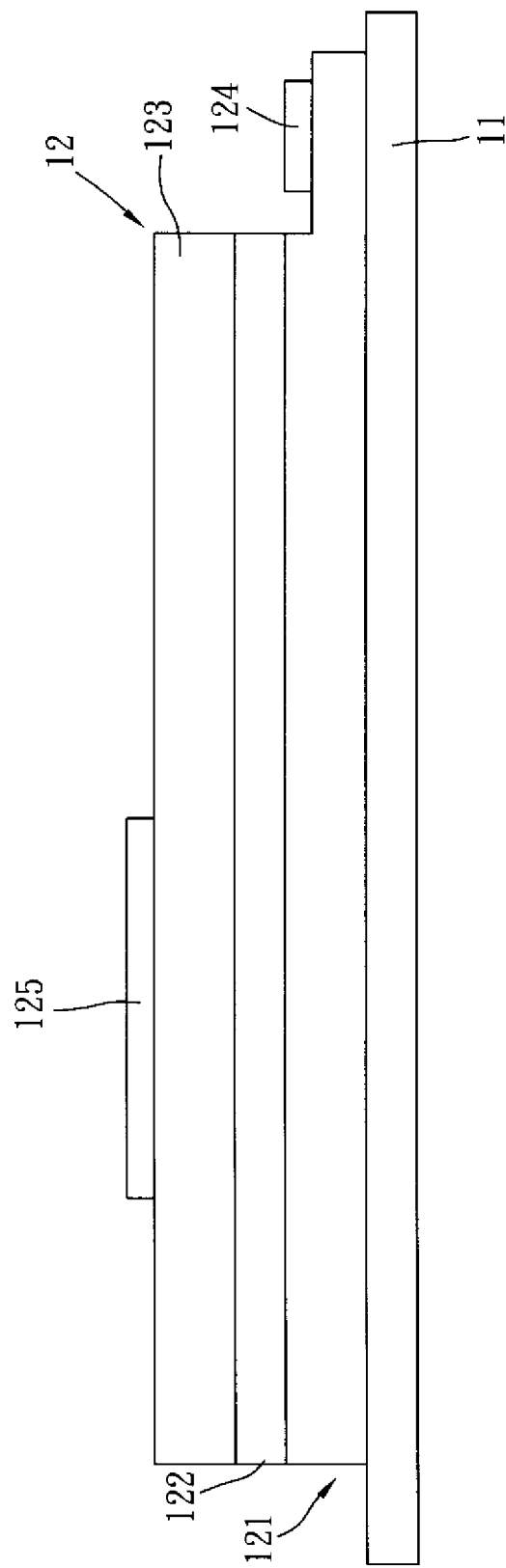
FIG. 1 is a schematic view of a conventional light emitting diode.

Before the present invention is described in greater detail with reference to the accompanying preferred embodiments, it should be noted herein that like elements are denoted by the same reference numerals throughout the disclosure.

Figure 3:
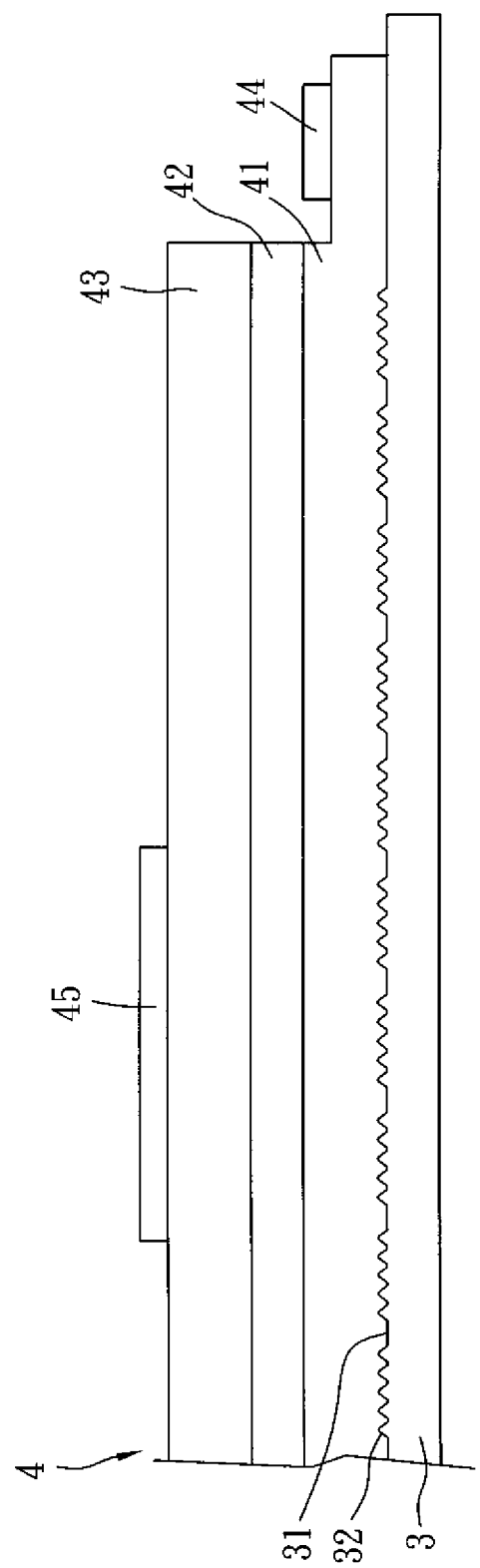
FIG. 3 is a schematic view of the preferred embodiment of a light emitting diode according to this invention.

Referring to FIG. 3, the preferred embodiment of a light emitting diode according to this invention is shown to include a patterned epitaxial substrate 3 and a light-emitting unit 4 that is disposed on the patterned epitaxial substrate 3 and that is capable of emitting light.

Figure 4:
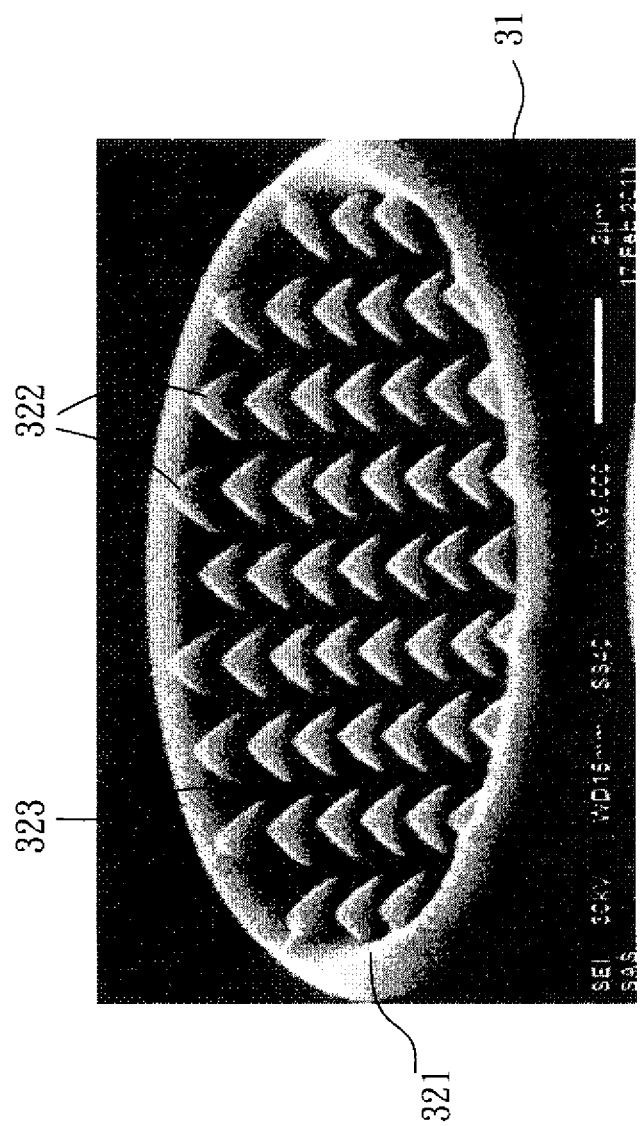
FIG. 4 is a scanning electron microscope image of a substrate pattern of a patterned epitaxial substrate of the light emitting diode shown in FIG. 3.
Figure 5:
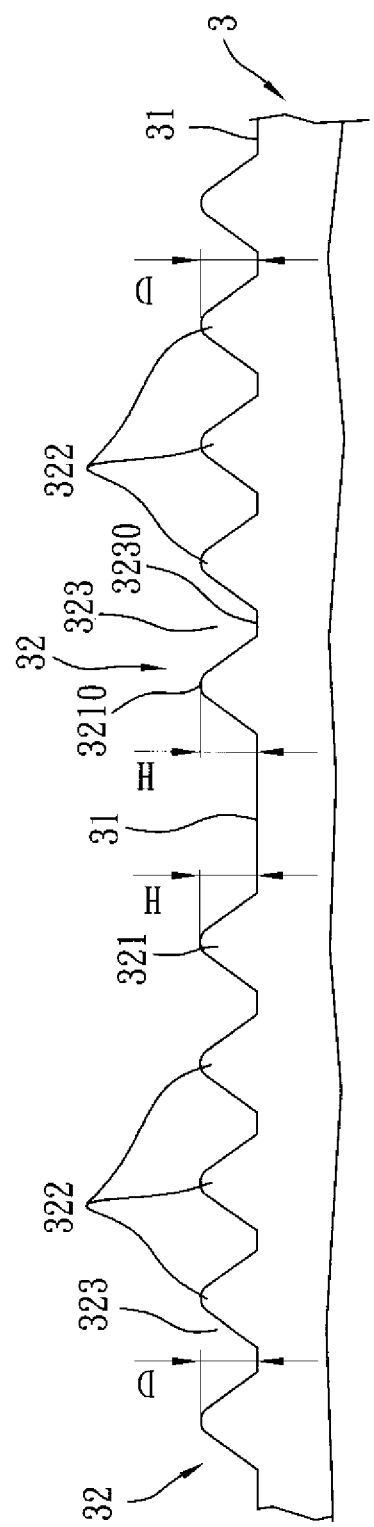
FIG. 5 is a fragmentary schematic view of the patterned epitaxial substrate shown in FIG. 3.

Further referring to FIGS. 4 and 5, the epitaxial substrate 3 is made of a material selected from sapphire, silicon, oxides, silicon carbide, etc., and includes a top surface 31 formed with a plurality of spaced apart substrate patterns 32. Each of the substrate patterns 32 has a surrounding wall 321 protruding from the top surface 31, a cavity 323 defined by the surrounding wall 321, and a plurality of protrusions 322 in the cavity 323. The protrusions 322 are spaced apart from each other and are formed in a substantially cone-shape. The surrounding wall 321 has a height (H), which is a distance between the top surface 31 and a top end 3210 of the surrounding wall 321. The cavity 232 has a depth (D), which is a distance between a bottom face 3230 of the cavity 323 and the top end 3210 of the surrounding wall 321. In this embodiment, the depth (D) is substantially the same as the height (H).

Referring to FIG. 3, the light-emitting unit 4 includes a first type semiconductor layer 41 formed on the substrate patterns 32 of the top surface 31, a light-emitting layer 42 formed on a portion of the first semiconductor layer 41, a second type semiconductor layer 43 formed on the light-emitting layer 42, and first and second electrodes 44, 45 that are respectively formed on a remaining portion of the first type semiconductor layer 41 and the second type semiconductor layer 43. When external power is supplied to the first and second electrodes 44, 45, the light-emitting layer 42 emits light due to photoelectric effect.

Specifically, the first and second type semiconductor layers 41, 43 have opposite electrical properties and are respectively made of groups III-V semiconductor materials, for example, gallium nitride series semiconductor materials. The light-emitting layer 42 is made of a material which is capable of emitting light due to photoelectric effect when receiving electricity. For example, the light-emitting layer 42 may be made of zinc sulfide (ZnS), cadmium sulfide (CdS), gallium phosphide (GaP), gallium arsenide phosphide ($GaAs_{1-x}P_x$), gallium aluminum arsenide (GaAlAs), gallium nitride (GaN), or other suitable materials. The first and second electrodes 44, 45 are independently made of a material selected from nickel, lead, cobalt, iron, titanium, copper, rhodium, gold, ruthenium, tungsten, zirconium, molybdenum, tantalum, platinum, silver, oxides or nitrides thereof, and combinations thereof. Because the materials selected for forming the light-emitting unit 4 are well-known in the art, detailed descriptions thereof are omitted for the sake of brevity. In this embodiment, the patterned epitaxial substrate 3 is made of sapphire, the first and second type semiconductor layers 41, 43 are respectively made of n-type and p-type gallium nitride, the light-emitting layer 42 is made of gallium nitride, and the first and second electrodes 44, 45 are made of platinum.

With the spaced apart substrate patterns 32 of the patterned epitaxial substrate 3, when the light from the light-emitting layer 42 travels to the protrusions 322 and the cavity 323 of the substrate patterns 32 and is reflected by the substrate patterns 32, the traveling direction of the light may be varied, thereby reducing the possibility of total reflection at an interface between the light-emitting unit 4 and air, and thereby enhancing the light extraction rate of the light emitting diode of this invention.

Figure 6:
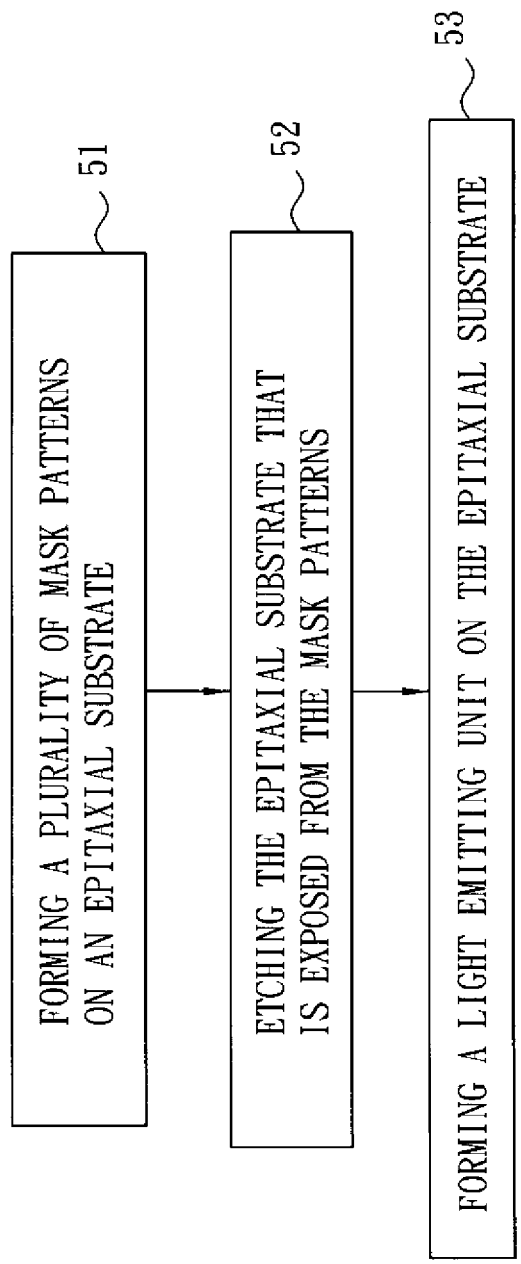
FIG. 6 is a flow chart illustrating the preferred embodiment of a method for forming a light emitting diode according to this invention.
Figure 7:
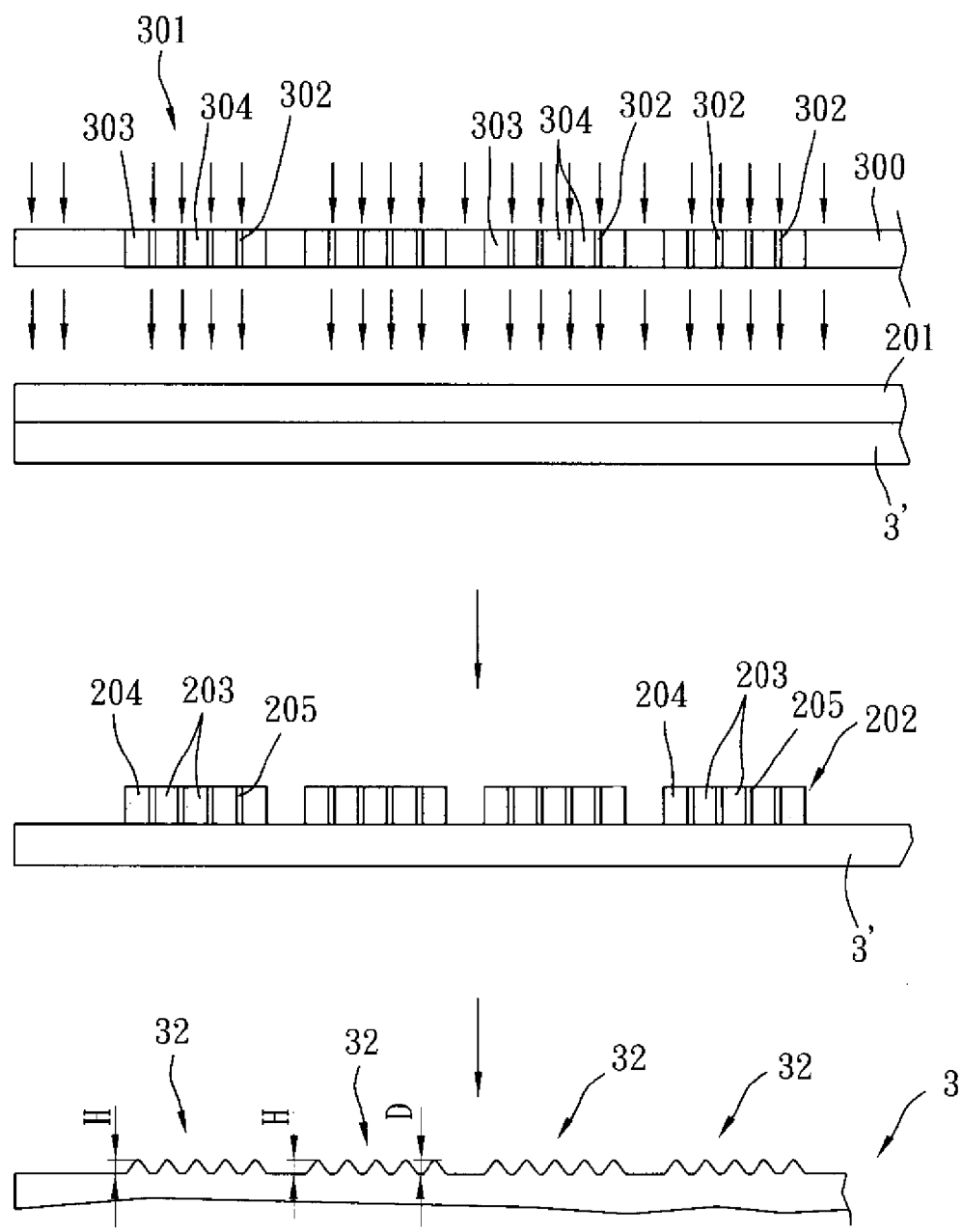
FIG. 7 illustrates consecutive steps of a method for patterning an epitaxial substrate to obtain the patterned epitaxial substrate shown in FIG. 5.

Referring to FIGS. 6 and 7, the preferred embodiment of a method for forming the light emitting diode according to this invention comprises the following steps.

In step 51, a plurality of mask patterns 202 are formed on an epitaxial substrate 3'.

Figure 8:
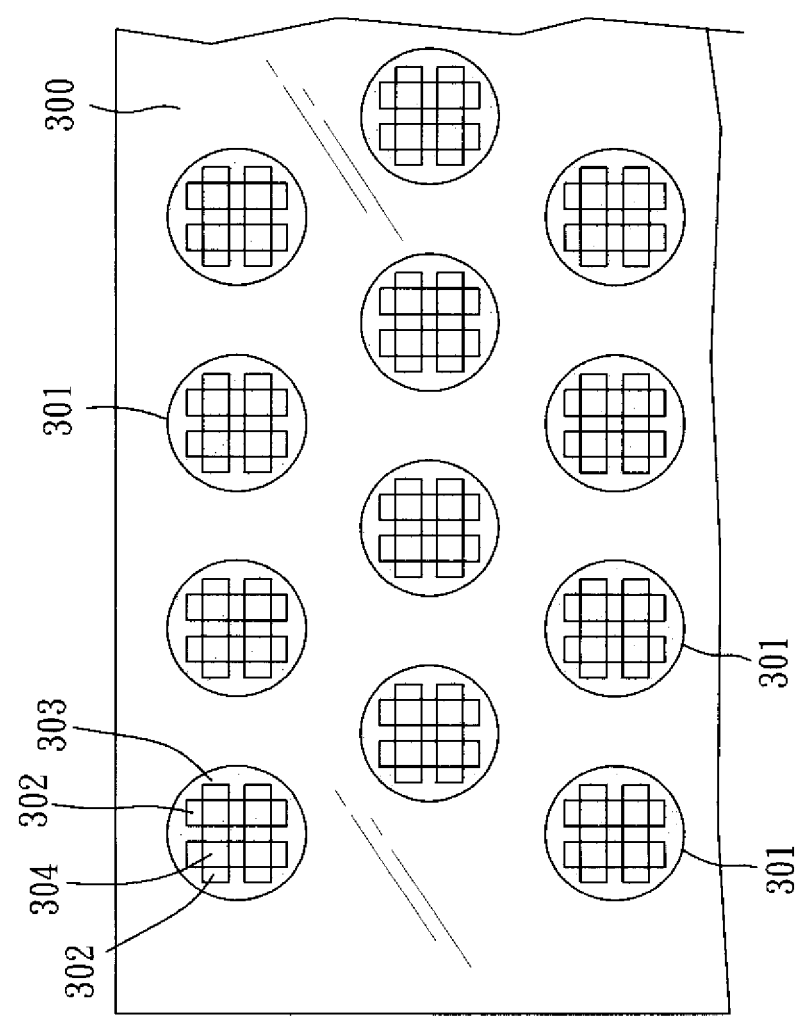
FIG. 8 is a fragmentary schematic view of a patterned cover mask layer used in the method shown in FIG. 7.
Figure 9:
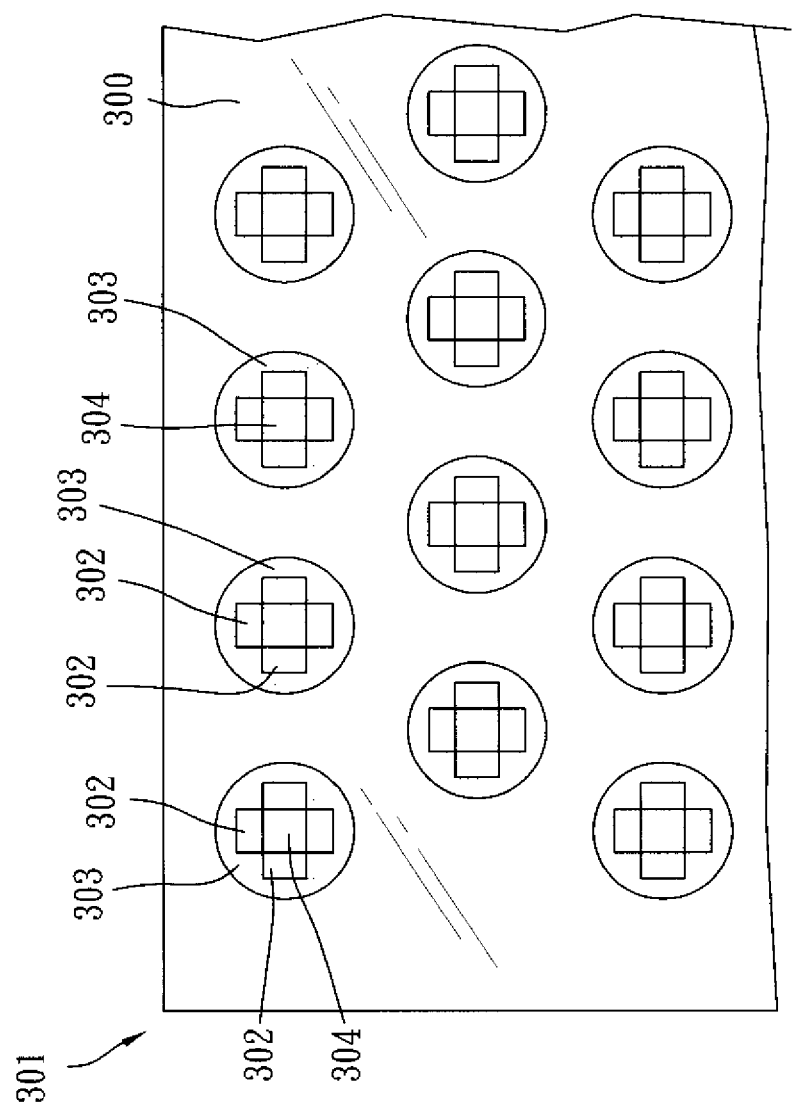
FIG. 9 is a fragmentary schematic view of another configuration of a patterned cover mask layer used in the method shown in FIG. 7.
Figure 10:
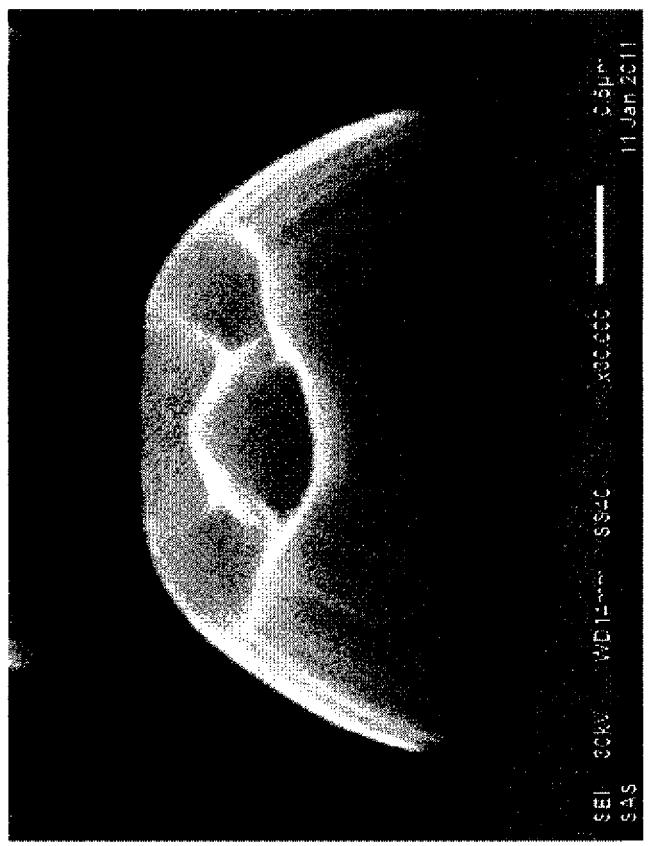
FIG. 10 is a scanning electron microscope image of a substrate pattern of the patterned epitaxial substrate that is formed using the patterned cover mask layer shown in FIG. 9.

In detail, an etch mask layer 201 is formed over the epitaxial substrate 3', and is then patterned using a patterned cover mask layer 300 having a plurality of cover patterns 301, thereby forming the etch mask layer 201 into a plurality of spaced apart mask patterns 202. The mask patterns 202 are formed corresponding to the cover patterns 301 of the patterned cover mask layer 300. The etch mask layer 201 may be made of silicon oxide ($SiO_2$), silicon nitride ($SiN_x$), or a photoresist material. The cover patterns 301 can be varied based on the required substrate patterns 32 and the type and selected material of the etch mask layer 201. For example, when each of the substrate patterns 32 has a plurality of protrusions 322, the patterned cover mask layer 300 is designed to have the spaced apart cover patterns 301 as shown in FIG. 8, in which the cover patterns 301 are circular-shape. Each of the cover patterns 301 includes a plurality of light-transmissive regions 302 that are substantially rectangular-shape and are misaligned, a plurality of first cover regions 304 each of which is surrounded by four of the light-transmissive regions 302, and a second cover region 303 that surrounds the light-transmissive regions 302 and the first cover regions 304. When each of the substrate patterns 32 has only a protrusion 322 as shown in FIG. 10, the patterned cover mask layer 300 is designed to have the spaced apart cover patterns 301 as shown in FIG. 9. Each of the cover patterns 301 includes a first cover region 304 that is centrally located and that is substantially square-shape, four light-transmissive regions 302 that surround the first cover region 304, and a second cover region 303 that surrounds the light-transmissive regions 302 and the first cover region 304. It should be noted that the shapes of the first and second cover regions 304, 303 can be varied based on the shape of the protrusion(s) 322.

Besides, when the etch mask layer 201 is made of silicon oxide ($SiO_2$) or silicon nitride ($SiN_x$), the mask patterns 202 can be formed by disposing the patterned cover mask layer 300 over the etch mask layer 201, followed by etching the etch mask layer 201 through the patterned cover mask layer 300. In this case, the light-transmissive regions 302 are through-holes. When the etch mask layer 201 is made of the photoresist material, the mask patterns 202 are formed by lithographically patterning the etch mask layer 201 using the patterned cover mask layer 300. Since the etching and lithography processes are well-known in the art, detailed descriptions thereof are omitted for the sake of brevity. It should be noted that, if lithography process is used to form the mask patterns 202, the cover mask layers 300 shown in FIGS. 8 and 9 are suitable for the etch mask layer 201 made of a positive-type photoresist material. If the etch mask layer 201 is made of a negative-type photoresist material, the cover patterns 301 of the cover mask layers 300 should be changed accordingly. In this embodiment, the etch mask layer 201 is made of a positive-type photoresist material, and the patterned cover mask layer 300 has the cover patterns 301 as shown in FIG. 8.

In this preferred embodiment, the step 51 is conducted by forming the etch mask layer 201 made of the positive-type photoresist material on the epitaxial substrate 3', followed by lithographically patterning so as to form the etch mask layer 201 into the mask patterns 202. Each of the mask patterns 202 includes: a plurality of first mask regions 203 that mask the epitaxial substrate 3' and that are formed at positions corresponding to the first cover regions 304 (FIG. 8); a plurality of exposing regions 205 that expose the epitaxial substrate 3' and that are formed at positions corresponding to the light-transmissive regions 302 (FIG. 8); and a second mask region 204 that masks the epitaxial substrate 3', that surrounds the first mask regions 203 and the exposing regions 205, that is spaced apart from the first mask regions 203 by the exposing regions 205, and that is formed at a position corresponding to the second cover region 303 (FIG. 8).

In step 52, the epitaxial substrate 3' that is exposed from the mask patterns 202 is etched and the mask patterns 202 are removed so as to form the patterned epitaxial substrate 3 with the above-mentioned substrate patterns 32.

The etching process in step 52 may be conducted by dry etching (such as high density plasma etching or reactive ion etching) or wet etching. The etchant used in the wet etching may be a solution of phosphoric acid, a mixing solution of sulfuric acid and phosphoric acid, or a solution of potassium hydroxide. In each of the substrate patterns 32, the surrounding wall 321 is formed at a position corresponding to the second mask region 204 of a respective one of the mask patterns 202, the cavity 323 is formed at a position corresponding to the exposing regions 205 of the respective one of the mask patterns 202, and the protrusions 322 are formed at a position corresponding to the first mask region 203 of the respective one of the mask patterns 202. The depth (D) of the cavity 323 can be adjusted by controlling the etching parameters in step 52 so that the depth (D) of the cavity 323 is smaller than or equal to the height (H) of the surrounding wall 321. In this embodiment, the step 52 is conducted by dry etching the epitaxial substrate 3' that is exposed from the mask patterns 202 so that the depth (D) is substantially equal to the height (H), followed by removing the mask patterns 202 to obtain the patterned epitaxial substrate 3 with the substrate patterns 32.

It should be noted that when the patterned cover mask layer 300 has the cover patterns 301 shown as FIG. 9, the epitaxial substrate 3 having a plurality of the substrate patterns, one of which is shown in FIG. 10, can be obtained.

Finally, in step 53, the light-emitting unit 4 is formed on the epitaxial substrate 3.

The step 53 is conducted by forming the first type semiconductor layer 41 on the substrate patterns 32 of the epitaxial substrate 3, growing epitaxially the light-emitting layer 42 on a portion of the first type semiconductor layer 41, and forming the second type semiconductor layer 43 on the light-emitting layer 42, followed by respectively forming the first and second electrodes 44, 45 on a remaining portion of the first type semiconductor layer 41 and the second type semiconductor layer 43. Accordingly, the light emitting diode of this invention is obtained.

Figure 2:
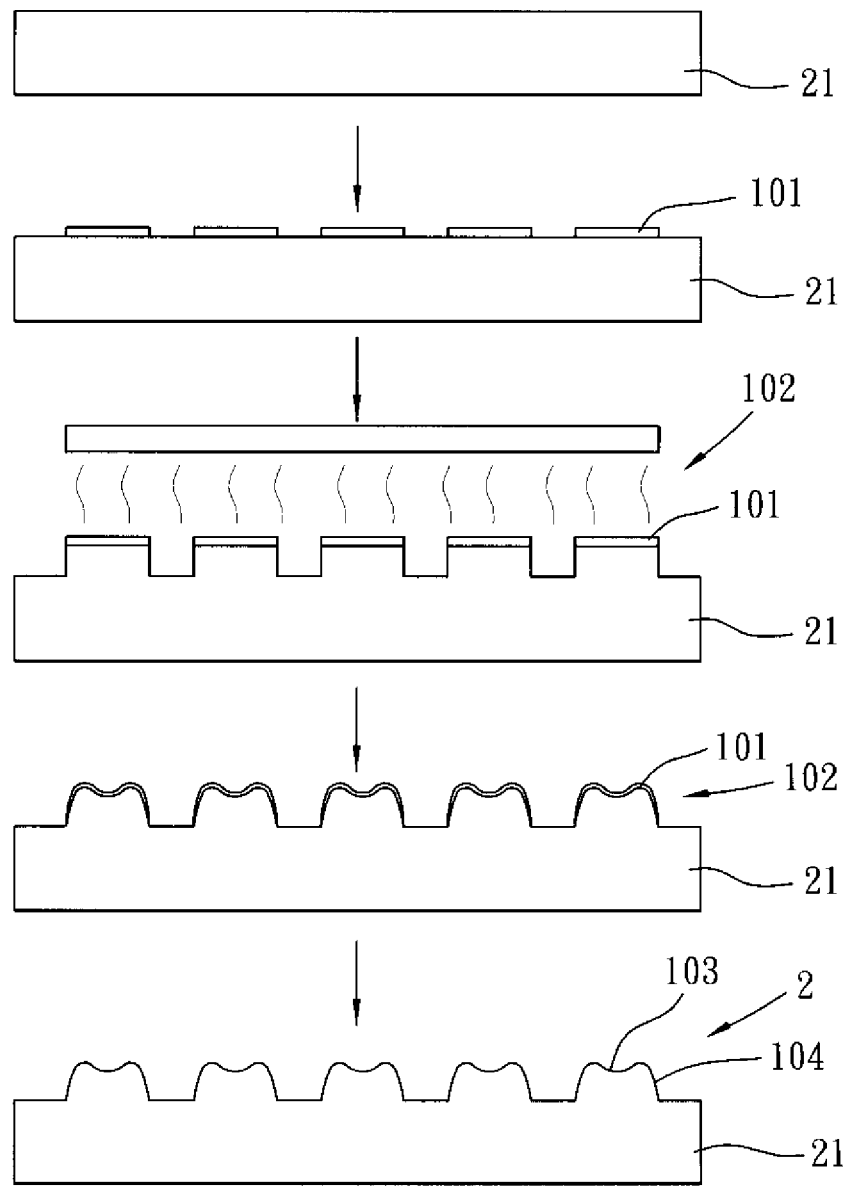
FIG. 2 illustrates consecutive steps of a method for forming an epitaxial substrate disclosed in U.S. patent application publication no. 2010/0059789.

Compared with the method for forming the conventional LED, in which the substrate patterns 102 are formed by controlling the thickness of the photoresist patterns 101 using the heat treatment (see FIG. 2), the method for forming the epitaxial substrate 3 with the substrate patterns 32 according to this invention is easily controlled, and the light emitting diode of this invention including the patterned epitaxial substrate 3 has a relatively large light extraction rate. Besides, the uniformity of the substrate patterns 32 formed using the method of this invention can be enhanced. Furthermore, with the substrate patterns 32, the contact area between the first type semiconductor layer 41 and the epitaxial substrate 3 is increased, and the epitaxial defects (including dislocation defects) of the light-emitting unit 4 may be reduced so as to enhance the epitaxial quality of the light emitting diode of this invention.

Figure 11:
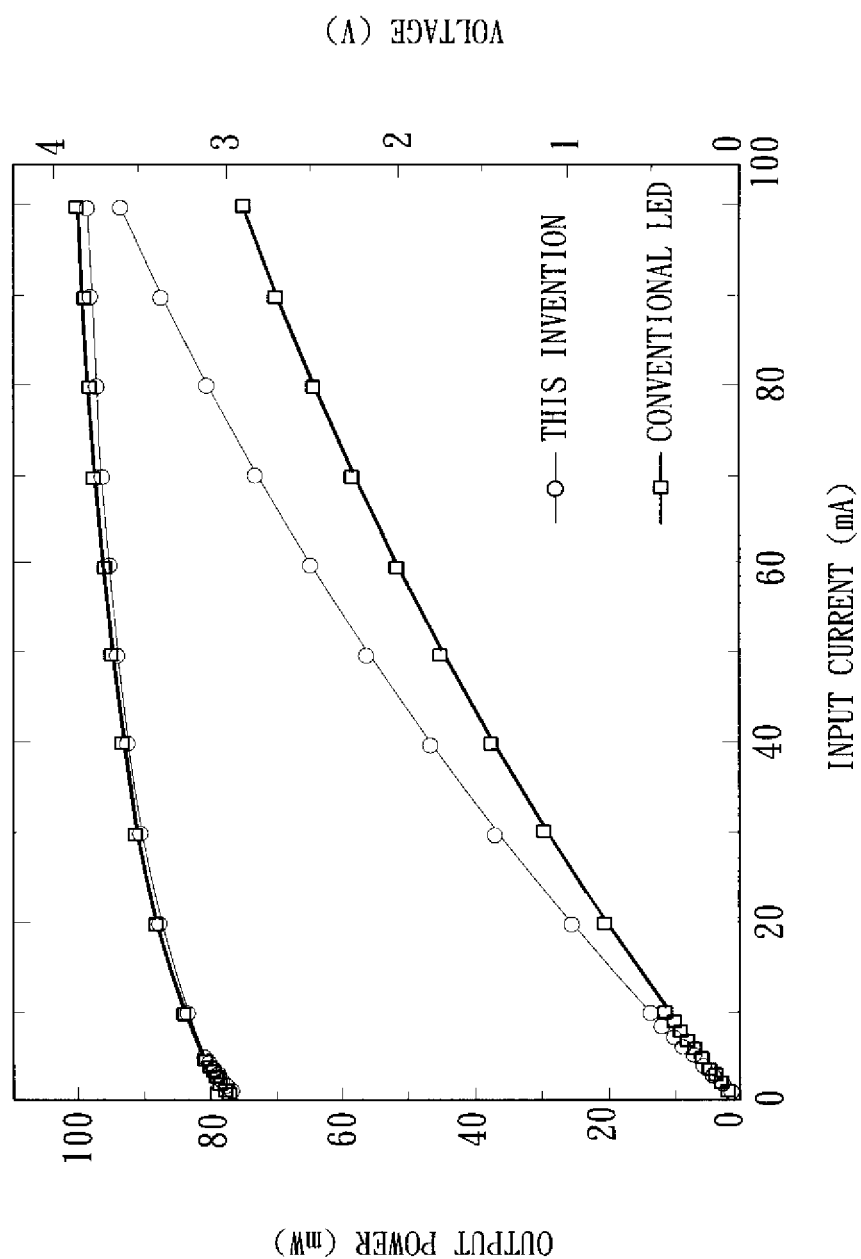
FIG. 11 is a plot illustrating the relations among an input current, an output power and a voltage of the light emitting diode of this invention, and the relations among the input current, an output power and a voltage of the conventional light emitting diode shown in FIG. 1.

Referring to two curves that are starting from coordinates (0, 0) shown in FIG. 11, when the input current is controlled at 20 mA, the light emitting diode of this invention, which has the epitaxial substrate 3 with the substrate patterns 32, has an output power greater than that of the conventional light emitting diode shown in FIG. 1 by 25%. This means that the luminance of the light emitting diode of this invention is greater than that of the prior art by 25%.

Figure 12A:
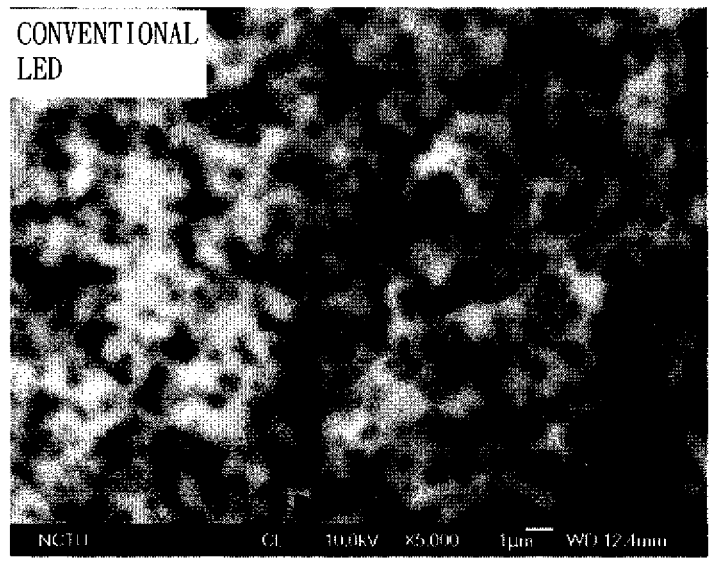
FIG. 12(a) is a cathodoluminescence (CL) image of the conventional light emitting diode shown in FIG. 1.
Figure 12B:
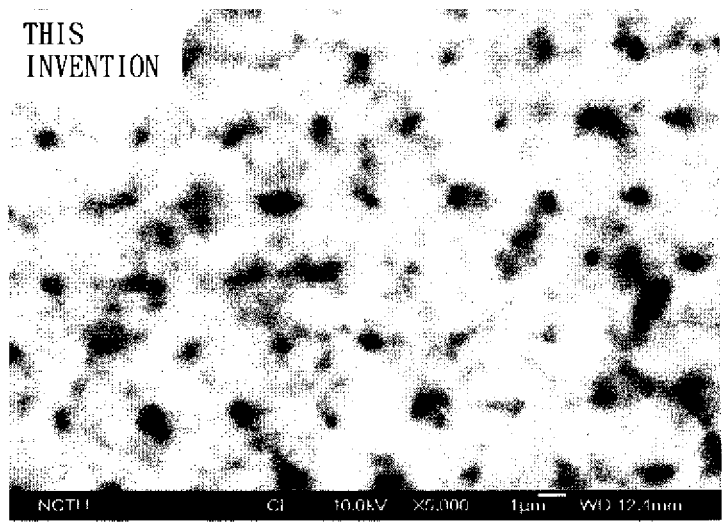
FIG. 12(b) is a cathodoluminescence (CL) image of the light emitting diode of this invention.

FIGS. 12(a) and 12(b) respectively represent the luminance of the light emitting diodes of the prior art and this invention. Non-radiative centers are formed due to dislocation defects of the light emitting diode, and may trap the carriers generated by light to form dark spots. It is apparent that the light emitting diode of this invention has improved light extraction rate and a relatively even luminance distribution. Thus, with the substrate patterns 32 of the epitaxial substrate 3, the non-radiative centers in the light emitting diode of this invention can be efficiently reduced.

Alternatively, in step 53, the first type semiconductor layer 41 is grown laterally and epitaxially over the substrate patterns 32 so that at least one gap (not shown) is formed between the first semiconductor layer 41 and one of the substrate patterns 32.

Figure 13A:
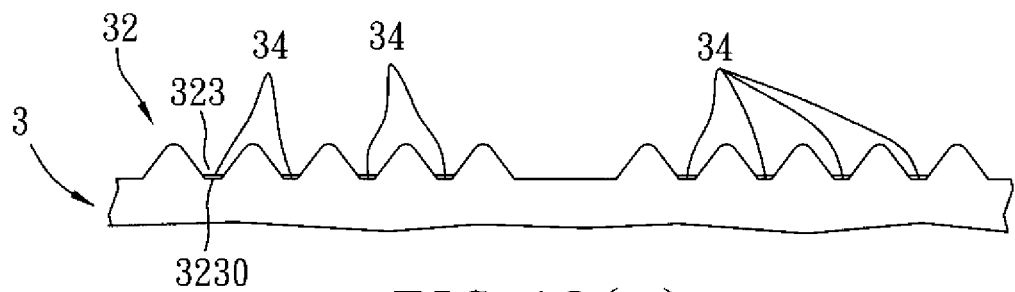
FIGS. 13(a) to 13(c) are fragmentary schematic views each of which illustrates positions of a buffer layer according to this invention.
Figure 13B:
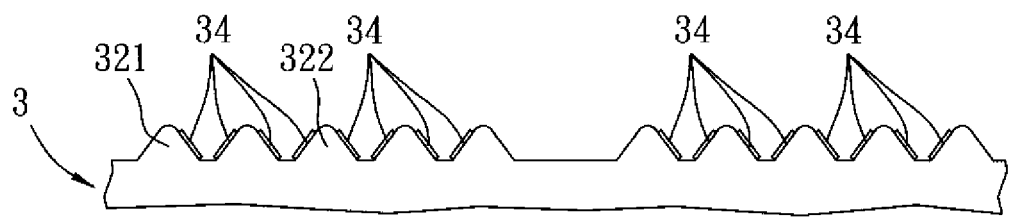
Figure 13C:
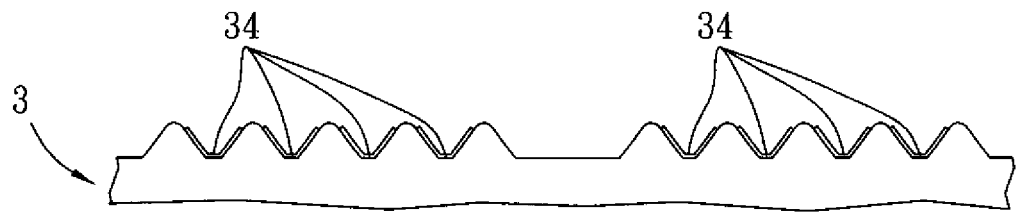

Referring to FIGS. 13(a) to 13(c), the method of this invention may further include, before step 53, a step of forming over the top surface 31 a buffer layer 34 that has a refractive index different from that of the epitaxial substrate 3. Because each of the gap and the buffer layer 34 has a refractive index different from that of the epitaxial substrate 3, light may be reflected or refracted in different directions, thereby improving the light extraction rate of the light emitting diode of this invention.

The buffer layer 34 may be formed on the substrate patterns 32 or the top surface 31 of the epitaxial substrate 3, on which the substrate patterns 32 are not formed. The buffer layer 34 is made of oxides, nitrides, silicon, silicide, or a high reflective material, such as metals or metal alloys. The position of the buffer layer 34 can vary based on a buffer layer forming process. For example, the buffer layer 34 may be formed on the bottom face 3230 of the cavity 323 (FIGS. 13(a) and 13(c)), and/or be formed around the protrusions 322 and an inner wall face of the surrounding wall 321 (FIGS. 13(b) and 13(c)). Besides, with the provision of the buffer layer 34, the dislocation defects due to lattice mismatch between the epitaxial substrate 3 and the first type semiconductor layer 41 can be alleviated.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A light emitting diode, comprising:
   an epitaxial substrate including a top surface and a plurality of substrate patterns on said top surface, each of said substrate patterns having a surrounding wall protruding from said top surface, a cavity defined by said surrounding wall, and at least one protrusion disposed in said cavity; and
   a light-emitting unit that is disposed on said substrate patterns of said top surface and that is capable of emitting light;
   wherein said light-emitting unit includes a semiconductor layer disposed on said substrate patterns, at least one gap being formed between said semiconductor layer and one of said substrate patterns.

2. The light emitting diode of claim 1, wherein each of said substrate patterns has a plurality of said protrusions in said cavity.

3. The light emitting diode of claim 2, wherein said protrusions are spaced apart from each other.

4. The light emitting diode of claim 1, wherein said epitaxial substrate is made of a material selected from the group consisting of sapphire, silicon, oxides, and silicon carbide.

5. The light emitting diode of claim 1, further comprising a buffer layer disposed between said epitaxial substrate and said light-emitting unit, said buffer layer having a refractive index which differs from that of said epitaxial substrate.

6. The light emitting diode of claim 5, wherein said buffer layer is made of a material selected from the group consisting of oxides, nitrides, silicon, silicide, metals and metal alloys.

7. A method for forming a light emitting diode, comprising:
   (a) forming an etch mask layer over an epitaxial substrate, and patterning the etch mask layer using a patterned cover mask layer to form the etch mask layer into a plurality of spaced apart mask patterns, each of the mask patterns having at least one first mask region that masks the epitaxial substrate, a plurality of exposing regions that expose the epitaxial substrate and surround the first mask region, and a second mask region that masks the epitaxial substrate, that surrounds the first mask region and the exposing regions, and that is spaced apart from the first mask region by the exposing regions;
   (b) etching the epitaxial substrate that is exposed from the mask patterns, and removing the mask patterns such that the epitaxial substrate is formed with a plurality of spaced apart substrate patterns, each of the substrate patterns having a surrounding wall, a cavity that is defined by the surrounding wall, and at least one protrusion that is disposed in the cavity; and
   (c) forming a light-emitting unit on the substrate patterns of the epitaxial substrate;
   wherein step (c) is conducted by growing laterally and epitaxially a semiconductor layer over the substrate patterns such that at least one gap is formed between the semiconductor layer and one of the substrate patterns.

8. The method of claim 7, wherein each of the mask patterns has a plurality of the first mask regions, the first mask regions being separated from each other and from the second mask region by the exposing regions such that each of the substrate patterns has a plurality of the spaced apart protrusions that are disposed in the cavity and that are surrounded by the surrounding wall.

9. The method of claim 7, wherein the surrounding wall has a height from the epitaxial substrate, and the cavity has a depth that is substantially the same as the height of the surrounding wall.

10. The method of claim 7, further comprising, before step (c), forming over the substrate patterns a buffer layer that has a refractive index different from that of the epitaxial substrate.

11. The method of claim 10, wherein the buffer layer is made of a material selected from the group consisting of oxides, nitrides, silicon, silicide, metals and metal alloys.

* * * * *